(12) United States Patent
Chen et al.

(10) Patent No.: US 6,391,750 B1
(45) Date of Patent: May 21, 2002

(54) METHOD OF SELECTIVELY CONTROLLING CONTACT RESISTANCE BY CONTROLLING IMPURITY CONCENTRATION AND SILICIDE THICKNESS

(75) Inventors: Susan H. Chen, Santa Clara; Paul R. Besser, Sunnyvale, both of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/639,799

(22) Filed: Aug. 17, 2000

Related U.S. Application Data

(60) Provisional application No. 60/149,423, filed on Aug. 18, 1999.

(51) Int. Cl.[7] .............................................. H01L 21/28
(52) U.S. Cl. ........................................ 438/583; 438/674
(58) Field of Search .................................. 438/231, 299, 438/592, 2, 583, 581, 630, 649, 651, 674; 257/384

(56) References Cited

U.S. PATENT DOCUMENTS

| | | | | |
|---|---|---|---|---|
| 5,034,348 A | * | 7/1991 | Hartswick et al. | 438/231 |
| 5,610,088 A | * | 3/1997 | Chang et al. | 438/231 |
| 5,654,212 A | * | 8/1997 | Jang | 438/231 |
| 5,953,612 A | * | 9/1999 | Lin et al. | 438/299 |
| 6,040,606 A | * | 3/2000 | Blair | 257/384 |
| 6,103,610 A | * | 8/2000 | Blair | 438/592 |
| 6,235,568 B1 | * | 5/2001 | Murthy et al. | 438/231 |

* cited by examiner

*Primary Examiner*—David Nelms
*Assistant Examiner*—Bau T Le

(57) ABSTRACT

Methods are provided that selectively provide various contact resistances based on each individual transistor's influence on an overall chip speed during the formation of active regions and silicide layers. In order to provide lower contact resistance to devices which have a critical influence on overall device speed, the active regions of such critical devices are formed with a lower impurity concentration and thicker silicide layers are provided on the active regions. Likewise, for the normal devices which have less or no influence on overall chip speed, thinner silicide layers are provided on the active regions having a higher impurity concentration than the critical devices.

11 Claims, 5 Drawing Sheets

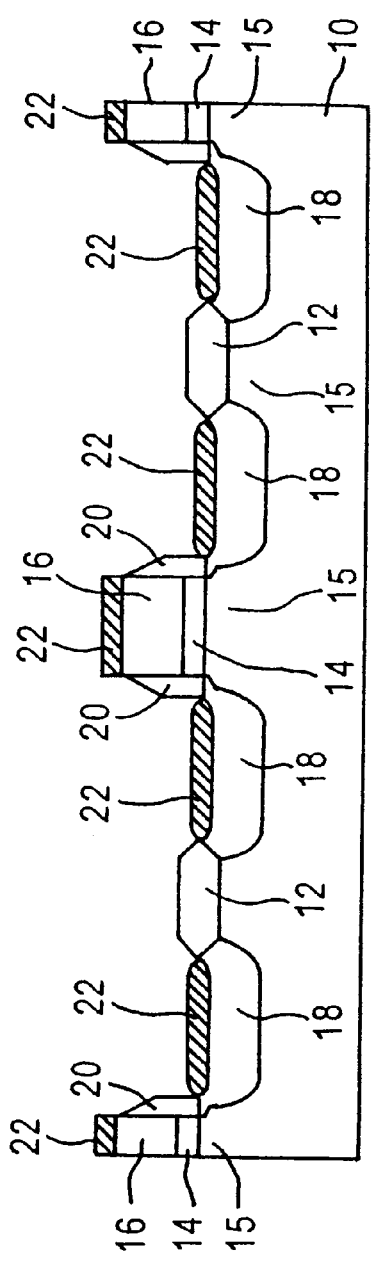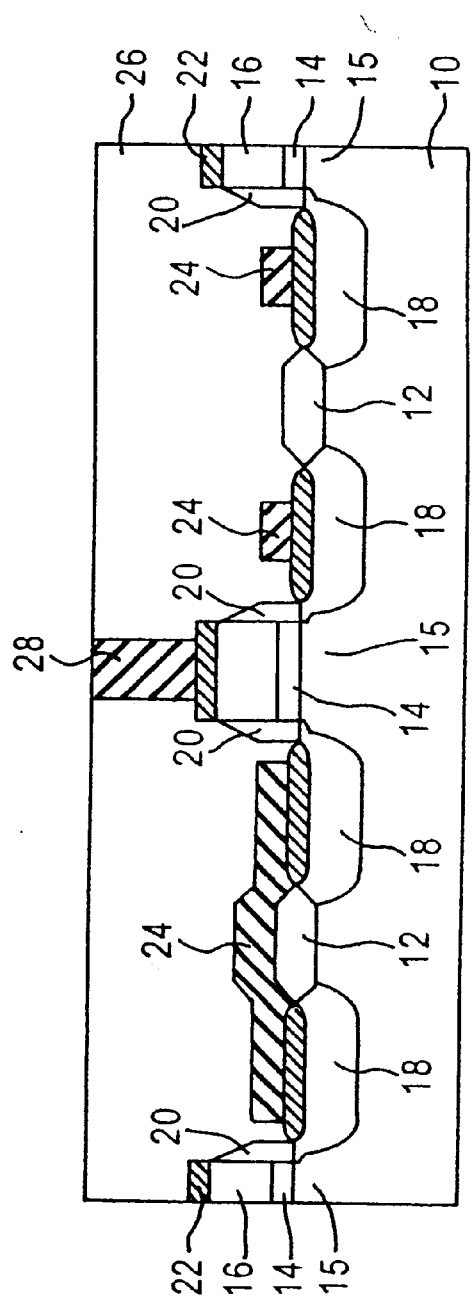
FIG. 1A
(PRIOR ART)
FIG. 1B
(PRIOR ART)

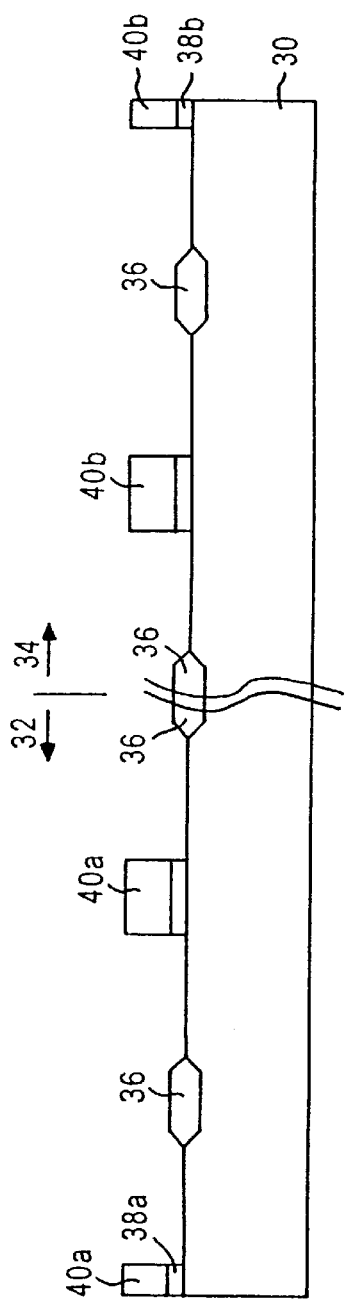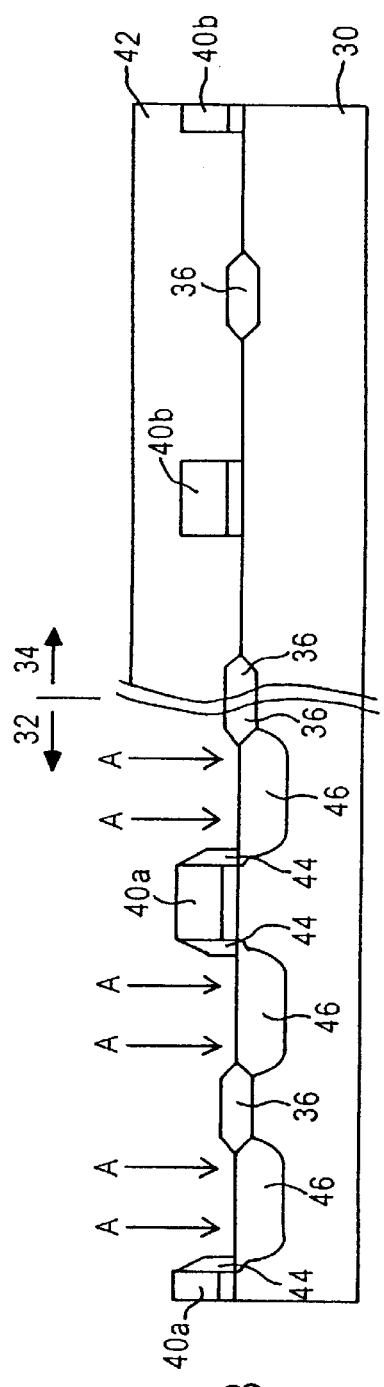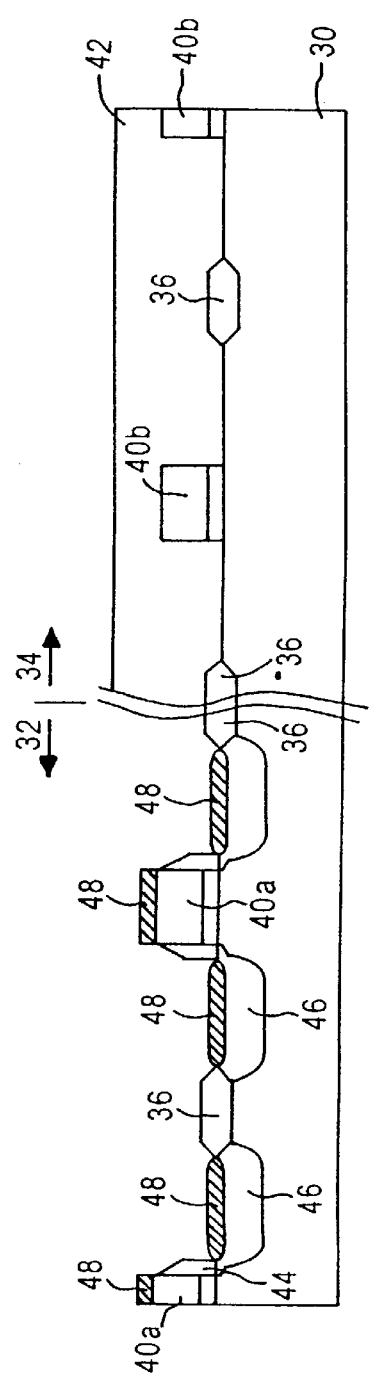

METHOD OF SELECTIVELY CONTROLLING CONTACT RESISTANCE BY CONTROLLING IMPURITY CONCENTRATION AND SILICIDE THICKNESS

This application claims benefit of Ser. No. 60/149,423 filed Aug. 18, 1999.

FIELD OF THE INVENTION

The present invention relates generally to semiconductor devices and manufacturing processes, and more particularly to methods for differentially forming various contact resistance in semiconductor devices comprising high density metal'oxide semiconductor field effect transistor (MOSFET) devices.

BACKGROUND OF THE INVENTION

Over the last few decades, the electronic industry has undergone a revolution by the use of semiconductor technology to fabricate small and highly'integrated electronic devices. A large variety of semiconductor devices have been manufactured with various applications in numerous disciplines. Presently, the most common and important semiconductor technology is based on silicon, and one such silicon-based semiconductor devices is a Metal Oxide Semiconductor Field Effect Transistor (MOSFET).

The principle elements of a typical MOSFET device comprise, as shown in FIGS. 1A and 1B, a semiconductor substrate 10, typically lightly doped monocrystalline silicon. A gate electrode 16, typically a heavily doped conductor, is disposed on the substrate 10 and a gate input signal is applied to the gate electrode 16 via a gate terminal 28 in FIG. 1B. A channel region 15 is formed in the substrate 10 below the gate electrode 16. Heavily doped active regions 18, i.e., source and drain regions, are formed at both sides of the channel region 15 within the substrate 10. The gate electrode 16 is separated from the substrate 10 by a gate insulation layer 14 to prevent current from flowing between the gate electrode 16 and the source and drain regions 18 or the channel region 15. Sidewall spacers 20 are disposed on the side surfaces of the gate electrode 16. Dielectric insulators 12 are locally provided to electrically isolate one transistor from another. Various horizontal conductive lines 24 are formed over the substrate, electrically contacting the active regions 18 or gate electrodes 16 of the transistors and devices for intra-layer interconnection. An interlayer dielectric 26 is provided over the substrate 10, covering the elements described above, and through the openings formed in the interlayer dielectric 26, vertical conductive lines 28 are formed to provide conductive paths among the transistors and devices in different layers for inter-layer interconnection.

As transistor dimensions approached one micron in diameter, conventional parameters resulted in intolerable increased resistance between the active region 18 and the conductive lines 24, 28. The principle way of reducing such contact resistance is by formation of a metal silicide 22 atop the active regions 18 and gate electrodes 16 prior to application of the conductive film for formation of the various conductive lines 24, 28. One common metal silicide material is $TiSi_2$. The $TiSi_2$ material is typically provided by first applying a thin layer of titanium atop the wafer which contacts the active regions. Then, the wafer is subjected to one or more high temperature annealing steps. This causes the titanium to react with the silicon of the active regions and gate electrodes, thereby forming $TiSi_2$. Such a process is referred to as a salicide (self-aligned silicide) process because the $TiSi_2$ is formed only where the titanium material contacts the silicon active regions and polycrystalline silicon gate electrodes.

As device dimensions continue to shrink, thicker silicide layers are required to reduce the contact resistance. Conventionally, silicide has been formed with a uniform thickness over the entire active regions on a single chip, without considering each individual transistor's influence on the overall chip speed. In such cases, failure to provide a sufficient amount of silicide on the active regions causes degradation of overall chip speed. In addition, the uniform thickness silicide formation results in forming an excessive amount of silicide on the active regions that have less influence on the overall chip speed, thereby increasing the manufacturing costs.

Thus, there is a continuing need for improved methods and structures that enable the selective formation of various contact resistances depending on each device's criticality and influence on the overall chip speed performance.

SUMMARY OF THE INVENTION

The present invention provides methods and structures that increase the overall chip speed performance and reduces the manufacturing costs during the formation of both intra-layer and inter-layer interconnects by selectively providing various contact resistances based on each individual transistor's influence on overall chip speed.

Thus, in accordance with one aspect of the present invention, there is provided a method for selectively controlling contact resistance in semiconductor devices. The method includes forming first silicide layers having a first thickness on first active regions having a first impurity concentration in a first device region, and forming second silicide layers having a second thickness greater than the first thickness on second active regions having a second impurity concentration smaller than the first impurity concentration in a second device region.

Thus, in accordance with one aspect of the present invention, there is provided a method for selectively controlling contact resistance in semiconductor devices. The method includes forming first silicide layers having a first thickness on first active regions having a first impurity concentration in a first device region, and forming second silicide layers having a second thickness greater than the first thickness on second active regions having a second impurity concentration smaller than the first impurity concentration in a second device region.

In accordance with another aspect of the present invention, there is provided a another method for selectively controlling contact resistance in a semiconductor device. The method includes forming first active regions having a first impurity concentration within a first device region and second active regions having a second impurity concentration smaller than the first impurity concentration within a second device region; and forming silicide on the first and second active regions.

In accordance with a still further aspect of the present invention, there is provided a semiconductor device structure which comprises a first device region and a second device region. The first device region comprises first active regions having a first impurity concentration and first silicide layers formed on the first active regions and having a first thickness. The second device region comprises second active regions having a second impurity concentration smaller than the first impurity concentration and second silicide layers formed on the second active regions and having a second thickness greater than the first thickness.

The foregoing and other features, aspects and advantages of the present invention will become more apparent from the following detailed description of the present invention when taken in conjunction with the accompanying drawings.

BRIEF DESCRIPTION OF THE DRAWINGS

The present invention is illustrated by way of example, and not by way of limitation, in the figures of the accompanying drawings and in which like reference numerals refer to similar elements in which;

FIG. 1A depicts a cross-section of a portion of a prior art semiconductor wafer that has a plurality of MOSFET devices, local dielectric insulators, and a plurality of silicide layers formed on the active regions and gate electrodes of the MOSFET devices.

FIG. 1B depicts a cross-section of the portion of a FIG. 1A following an interlayer dielectric formation process and inter-layer and intra-layer interconnect processes.

FIG. 2A depicts a cross-section of a portion of a semiconductor wafer having a substrate, first and second device regions, a plurality of gate electrodes and gate oxide films, and a plurality of local isolation regions, in accordance with one embodiment of the present invention;

FIG. 2B depicts a cross-section of the portion of FIG. 2A during a first implantation process in which first active regions are formed within the first device region after masking the second device region, in accordance with one embodiment of the present invention;

FIG. 2C depicts the portion of FIG. 2B following a first silicide deposition process in which first silicide layers are formed at a first thickness on the first active regions and gate electrodes within the first device region, in accordance with one embodiment of the present invention;

DETAILED DESCRIPTION OF THE EXEMPLARY EMBODIMENTS

Figure 2D:
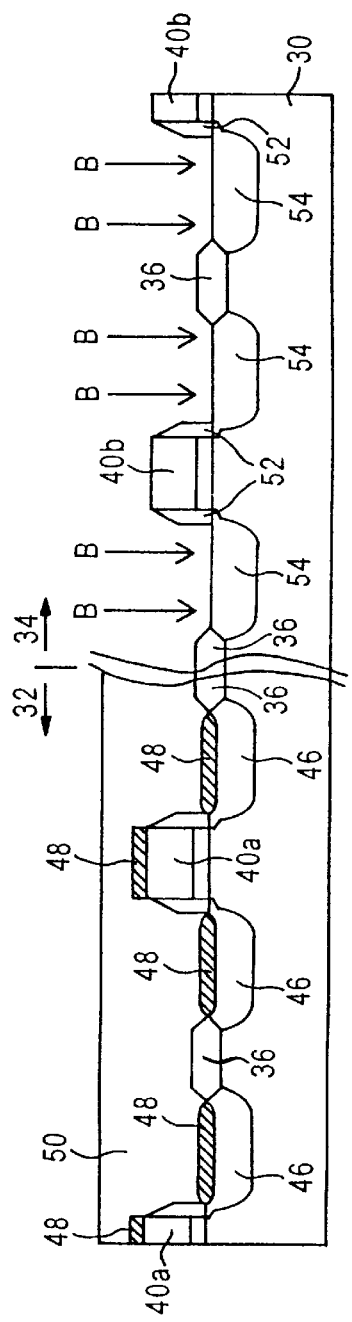
FIG. 2D depicts the portion of FIG. 2C during a second ion implantation process in which second active regions are formed within the second device region after unmasking the second device region and masking the first device region, in accordance with one embodiment of the present invention.

The process steps and structures described below do not form a complete process flow for manufacturing integrated circuits. The present invention can be practiced in conjunction with integrated circuit fabrication techniques currently used in the art, and only so much of the commonly practiced process steps are included as are necessary for an understanding of the present invention. The figures representing cross-section portions of an integrated circuit device during fabrication are not drawn to scale, but instead are drawn to illustrate the feature of the present invention.

In accordance with certain embodiments of the present invention, methods are provided that selectively provide various contact resistance based on each individual transistor's influence on an overall chip speed during the formation of active regions and silicide layers. As part of the present invention, it was recognized that the formation of silicide layers with a uniform thickness on entire active regions may cause the formation of an insufficient amount of silicide on the active regions having the most critical influence on an overall chip speed performance. Accordingly, the failure to provide a sufficient amount of silicide on those specific regions results in the degradation of the overall chip speed performance. In addition, the formation of a silicide layer having a uniform thickness causes an excessive amount of silicide to be formed on those active regions having less or no influence to an overall chip speed performance, thereby increasing the manufacturing costs.

Thus, in accordance with the present invention, various contact resistances are formed depending on each individual device's criticality and influence on an overall chip speed by selectively controlling the impurity concentration of the active regions and thickness of the silicide layers formed on the active regions. For example, in order to provide lower contact resistance to a device which has a critical influence on an overall device speed, the active regions are formed with a lower impurity concentration and thicker silicide layers are provided on these active regions. Likewise, for other devices which have lesser or no influence on an overall chip speed, thinner silicide layers are provided on their active regions that are formed with a higher impurity concentration than the critical devices.

With this in mind, FIG. 2A depicts a cross-section of a semiconductor wafer, in accordance with an exemplary embodiment of the present invention, comprising a semiconductor substrate 30, typically lightly doped monocrystalline silicon, having a top surface. The substrate 30 has a normal device region 32 and critical device region 34 on its top surface. A plurality of first gate electrodes 40a are formed on the top surface of the substrate 30 within the normal device region 32, and a plurality of gate oxide layers 38a are formed between each first gate electrode 40a and the top surface of the substrate 30. A plurality of local isolation regions 36, for example, field oxide or shallow trench isolation, are formed between two neighboring first gate electrodes 40a. Likewise, a plurality of second gate electrodes 40b are formed on the top surface of the substrate 30 within the critical device region 34, and a plurality of gate oxide layers 38b are formed between each second gate electrodes 40b and the top surface of the substrate 30. The plurality of local isolation region 36 are also provided between two neighboring second gate electrodes 40b. In accordance with an embodiment of the present invention, those devices which have a significant influence on an overall chip speed will be formed within the confines of the "critical" device region 34 while those devices which have less or no influence on the overall chip speed will be formed within the confines of the "normal" device region 32.

FIG. 2B depicts the portion of FIG. 2A during an ion implantation process to form first active regions 46 within the first device region 32 while the second device region 34 is masked. A first mask layer 42 is selectively formed over the second device region 34 by conventional photolithography and etching techniques, thereby exposing the normal device region 32. An impurity, such as for example, boron for a PMOS device or arsenic for an NMOS device, is ion implanted into the exposed top surface of the substrate 30 within the normal device region 32, as shown by arrows A, to form a plurality of first active regions 46 within the normal device region 32. As a result, a plurality of MOSFET devices which have less or no influence on the overall chip speed are formed within the normal device region 32, each device comprising the gate electrode 40a, the gate oxide 38a and the first active regions 46, i.e., source and drain regions. Arsenic can be ion implanted to form the first active regions 46.

In FIG. 2C, first silicide layers 48, such as, for example, $TiSi_2$, $CoSi_2$, or $NiSi_2$, are selectively formed on the first active regions 46 with a first thickness sufficient to provide an appropriate amount of contact resistance to the devices formed in the normal device region 32 by conventional silicide deposition techniques. As well known, the first silicide layers 48 are selectively formed only on the active regions 46 and the gate electrode 40a because the silicide material deposited over the top surface reacts only with silicon, which is known to be salicide (self-aligned silicide). For example, a titanium layer is deposited by chemical vapor deposition over the exposed surface of the substrate 30 including the top surface of the active regions 48 and gate electrode 40a, and then the wafer is subjected to high temperature annealing, thereby forming the first silicide layers. Accordingly, the contact resistance in the normal device region 32 is determined by the combination of the impurity concentration of the first active regions 46 and the first thickness of the first silicide layers 48 formed on the first active regions 46.

In FIG. 2D, the first mask layer 42 is removed from the top surface of the substrate 30 within the critical device region 34, and a second mask layer 50 is formed over the top surface of the substrate 30 within the normal device region 32, exposing the critical device region 34. An impurity, such as for example, boron for a PMOS device or arsenic for an NMOS device, is ion implanted into the exposed top surface of the substrate 30 within the critical device region 34, as shown by arrows B, to form a plurality of second active regions 54 within the critical device region 34. As a result, a plurality of MOSFET devices which have critical influence on the overall chip speed are formed within the critical device region 34, each device comprising the gate electrode 40b, gate oxide 38b and the second active regions 54, i.e., source and drain regions.

The second active regions 54 of the critical device region 34 have an impurity concentration which is less than the impurity concentration of the first active regions 46 to lower the threshold voltage of the device in the critical device region 34, thereby decreasing the device turn-on time. Also, the lower impurity concentration causes the thickness of the silicide to increase, thereby lowering the contact resistance. As an exemplary embodiment of the present invention, arsenic is ion implanted to form the second active regions 54.

Figure 2E:
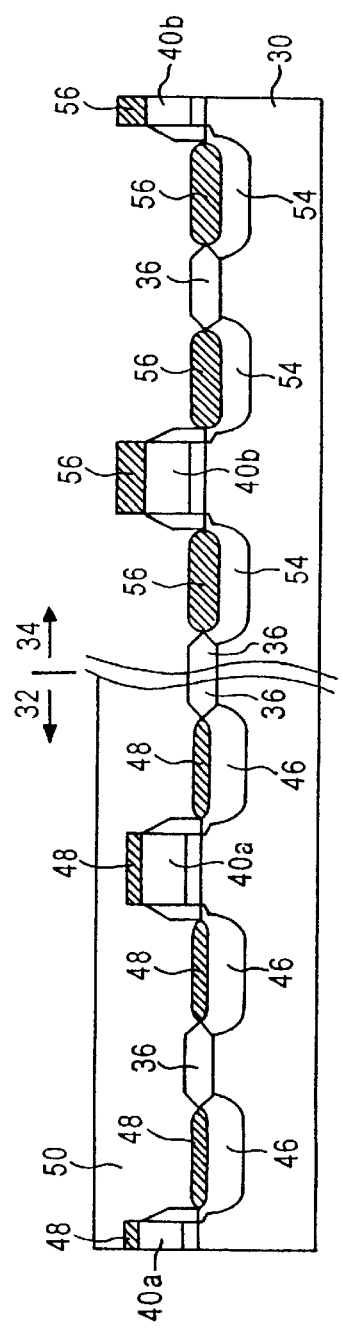
FIG. 2E depicts of the portion of FIG. 2D following a second silicide deposition process in which second silicide layers are formed at a second thickness on the second active regions and gate electrodes within the second device region, in accordance with one embodiment of the present invention.

In FIG. 2E, second silicide layers 48, for example, $TiSi_2$, $CoSi_2$, or $NiSi_2$, are selectively formed on the second active regions 46 at a second thickness which is greater than the first thickness of the first silicide layers such that the thicker silicide, combined with the smaller impurity concentration of the second active regions 54, provides a sufficiently reduced contact resistance within the critical device region 34. For example, a $TiSi_2$ layer is formed by chemical vapor deposition of titanium over the exposed surface of the substrate 30, including the top surface of the active regions 54 and gate electrodes 40b, and then the wafer is subjected to high temperature annealing, thereby forming the second silicide layers.

As such, the contact resistance in the critical device region 34 is decided by the combination of the impurity concentration of the second active regions 54 and the second thickness of the second silicide layers 56 formed on the second active regions 54.

Figure 2F:
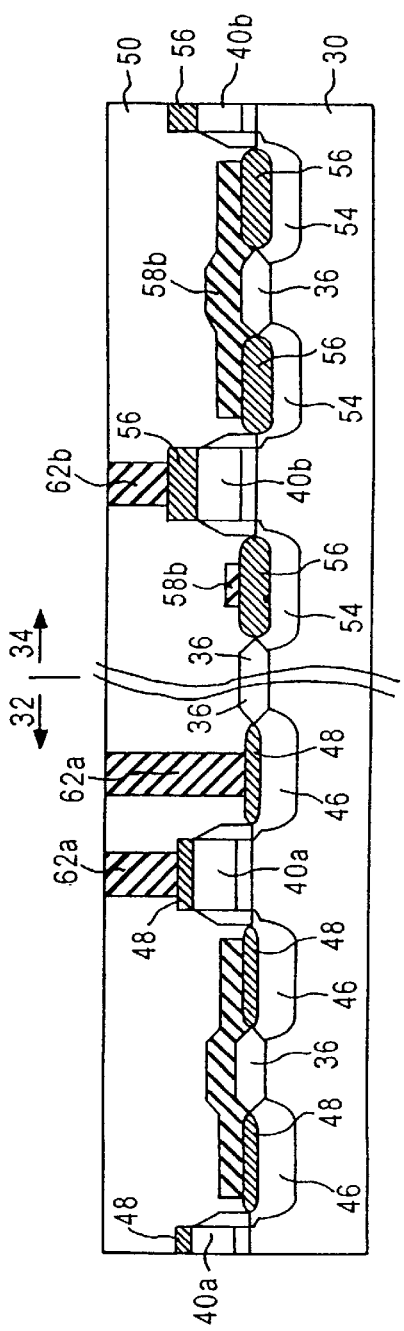
FIG. 2F depicts the portion of FIG. 2E following formation of an interlayer dielectric and inter-layer and intra-layer interconnects, in accordance with one embodiment of the present invention.

In FIG. 2F, the second mask 50 is removed from the top surface of the substrate 30 within the first device region 32. An intra-layer interconnect process is then performed to provide horizontal conductive paths by forming various metal lines 58a, 58b which interconnect the active regions of the neighboring devices. The reduced contact resistance in the second active regions 54 enables the input signals applied to the second active regions 54 to be transferred with less resistance than the input signals applied to the first active regions 46. An interlayer dielectric material, such as, for example, silicon oxide derived from TEOS, is then deposited over the top surface of the substrate 30 and the surface is planarized. An inter-layer interconnect process is then performed to provide vertical conductive paths 62a, 62b by forming via holes through the interlayer dielectric 60 and filling the via holes by a conductive material, such as tungsten. The thicker second silicide layers 56 formed on the gate electrode 40b within the critical device region 34 reduce the device turn on time.

Figure 3A:
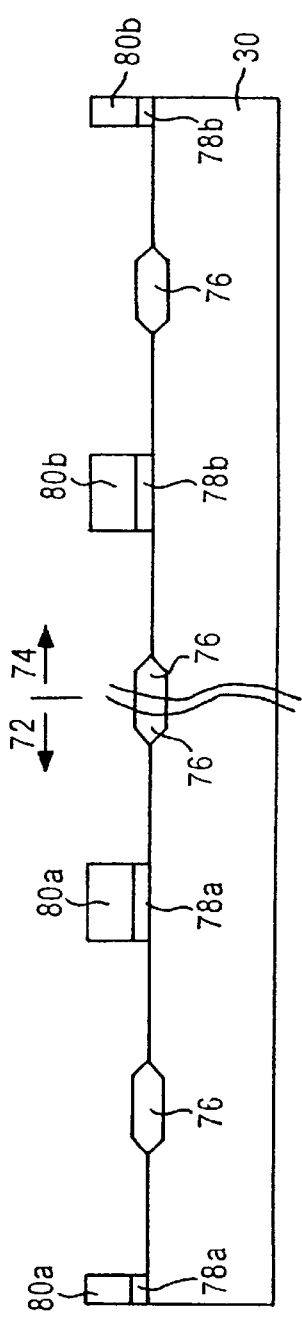
FIG. 3A depicts a cross-section of a portion of a semiconductor wafer having a substrate, first and second device regions, a plurality of gate electrodes and gate oxide films, and a plurality of local isolation regions, in accordance with another embodiment of the present invention.

FIG. 3A through FIG. 3E show another exemplary embodiment, in accordance with the present invention, of which the completed structure is shown in FIG. 3F that is structurally identical to the completed structure of the first embodiment as shown in FIG. 2F. As such, the present invention can be achieved in numerous methods and not limited to the certain embodiment described herein.

FIG. 3A depicts a cross-section of a semiconductor wafer, in accordance with another exemplary embodiment of the present invention, comprising a semiconductor substrate 70. The substrate 70 has a "normal" device region 72 and a "critical" device region 74 on its top surface. A plurality of first gate electrodes 80a are formed on the top surface of the substrate 70 within the normal device region 72, and a plurality of gate oxide layers 78a are formed between each first gate electrode 80a and the top surface of the substrate 70. A plurality of local isolation regions 76, for example, field oxide or shallow trench isolation, are formed between two neighboring first gate electrodes 80a. Likewise, a plurality of second gate electrodes 80b are formed on the top surface of the substrate 70 within the critical device region 74, and a plurality of gate oxide layers 78b are formed between each second gate electrode 80b and the top surface of the substrate 70. The plurality of local isolation regions 76 are also provided between two neighboring second gate electrodes 80b.

Figure 3B:
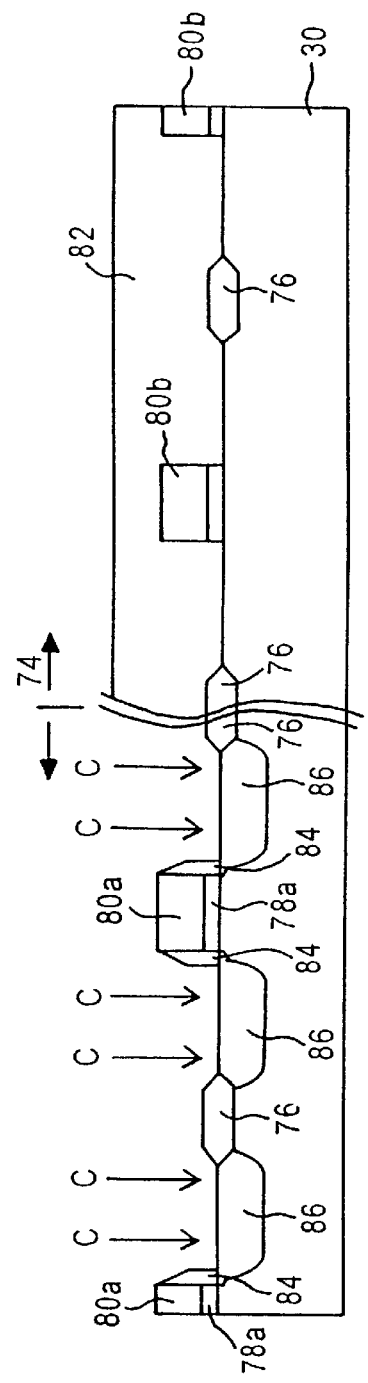
FIG. 3B depicts the portion of FIG. 3A during a first implantation process in which first active regions are formed within the first device region after masking the second device region, in accordance with another embodiment of the present invention.

FIG. 3B depicts the portion of FIG. 3A during an ion implantation process to form first active regions 86 within the first device region 72 while the second device region 74 is masked. A first mask layer 82 is selectively formed over the second device region 74, thereby exposing the normal device region 72. An impurity, such as for example, boron for a PMOS device or arsenic for an NMOS device, is ion implanted into the exposed top surface of the substrate 70 within the normal device region 72, as shown by arrows C, to form a plurality of first active regions 86 within the normal device region 72. As a result, a plurality of MOSFET devices which are less or no influence on the overall chip speed are formed within the normal device region 72, each device comprising the gate electrode 80a, the gate oxide 78a and the first active regions 86, i.e., source and drain regions. As an exemplary embodiment of the present invention, arsenic is ion implanted to form the first active regions 46.

Figure 3C:
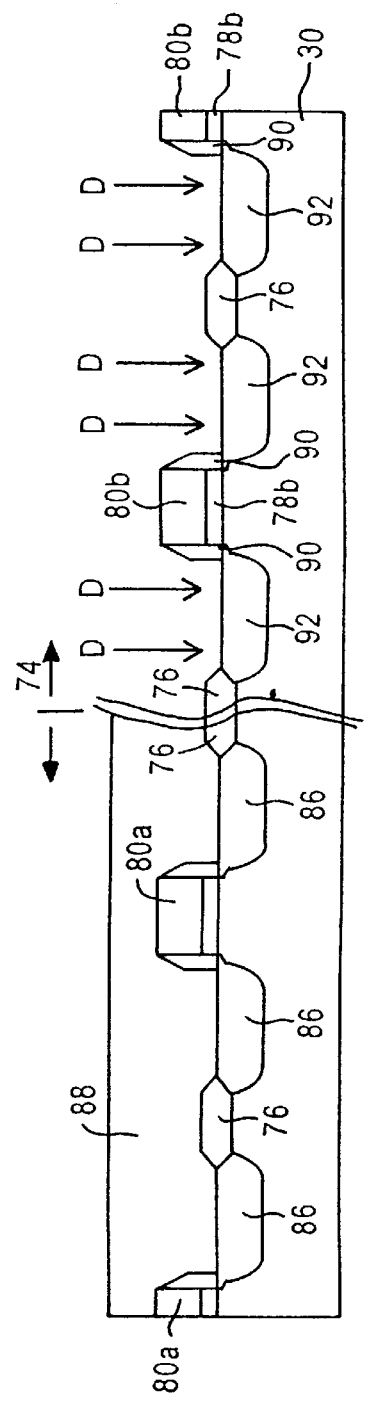
FIG. 3C depicts the portion of FIG. 3B during a second implantation process in which second active regions are formed within the second device region after unmasking the second device region and masking the first device region, in accordance with another embodiment of the present invention.

In FIG. 3C, the first mask layer 82 is removed form the top surface of the substrate 70 within the critical device region 74, and a second mask layer 88 is formed over the top surface of the substrate 70 within the normal device region 72, exposing the critical device region 74. An impurity, such as, for example, boron for a PMOS device or arsenic for an NMOS device, is ion implanted into the exposed top surface of the substrate 70 within the critical device region 74, as shown by arrows D, to form a plurality of second active regions 92 within the critical device region 74. As a result, a plurality of MOSFET devices which have critical influence on the overall chip speed are formed within the critical device region 74, each device comprising the gate electrode 80b, gate oxide 78b and the second active regions 92, i.e., source and drain regions.

Figure 3D:
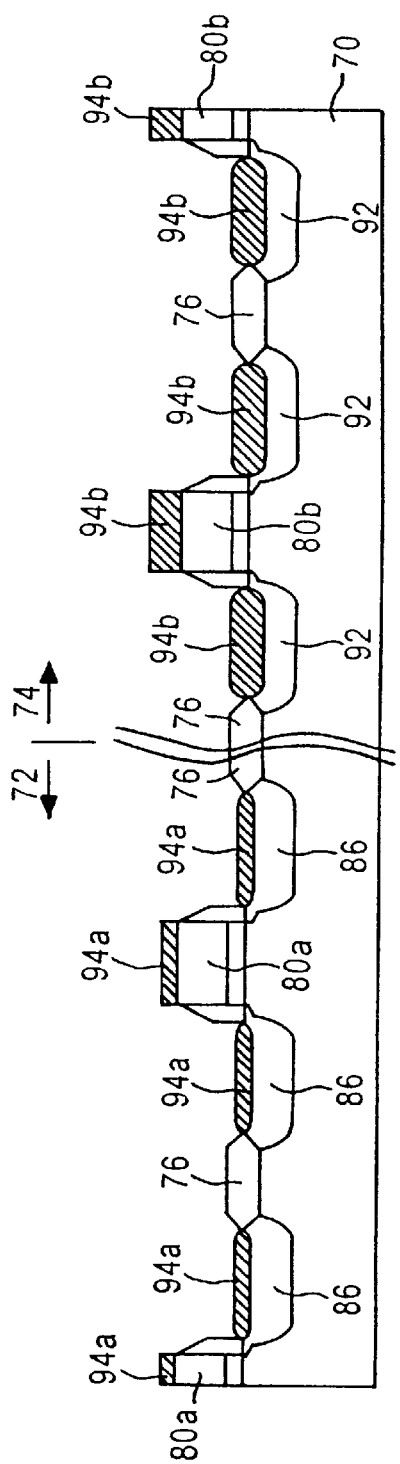
FIG. 3D depicts the portion of FIG. 3C following a silicide deposition process in which first and second silicide layers are respectively formed having first and second thickness on the first and second active regions and gate electrodes within the first and second device region, in accordance with another embodiment of the present invention.

In FIG. 3D, the second mask layer 88 is removed from the top surface of the substrate 70 within the normal device region 72, thereby exposing both the normal device region 72 and the critical device region 74. Subsequently, a silicide deposition process is performed to simultaneously form both first silicide layers 94a within the normal device region 72 and second silicide layers 94b within the critical device region 74. Due to the lower impurity concentration of the second active regions 92, as comparing to the first active regions 86, thicker silicide layers are formed on the second active regions 92 within the critical device region 74. Thus, a lower contact resistance is provided within the critical device region 74, thereby decreasing the device turn-on time. For example, a titanium layer is deposited by chemical vapor deposition over the exposed surface of the substrate 70 including the top surfaces of the first and second active regions 86, 92 and the gate electrodes 80a, 80b, and then the wafer is subject to high temperature annealing, thereby forming the first silicide layers 94a and the second silicide layers 94b. As such, by simultaneously forming the first and second silicide layers 94a, 94b, extra masking, silicide deposition and annealing steps are saved, thereby significantly reducing the manufacturing costs.

Figure 3E:
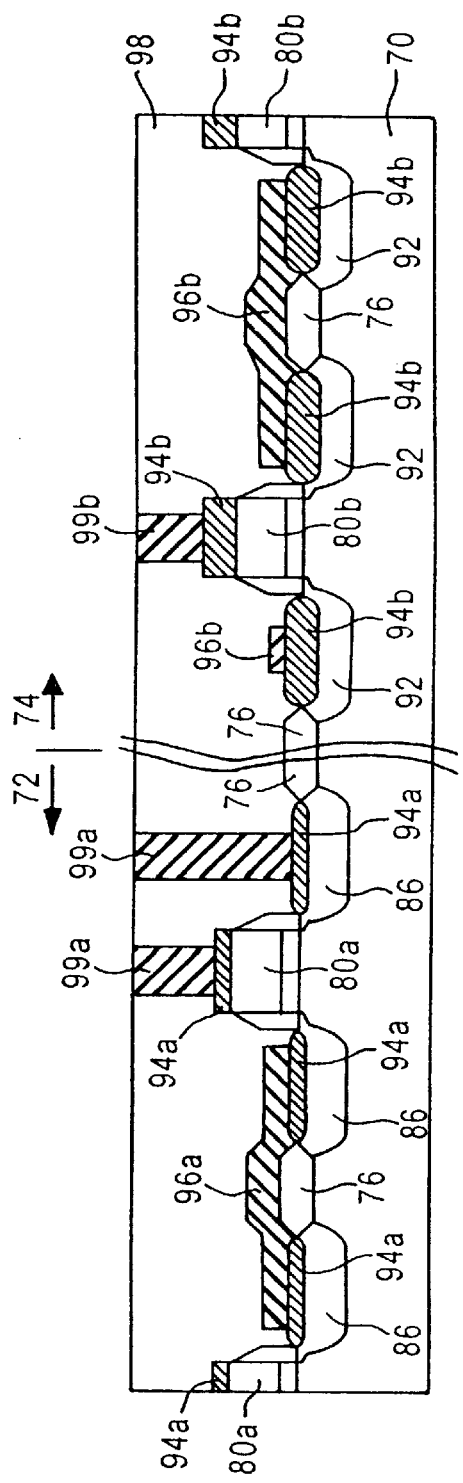
FIG. 3E depicts the portion of FIG. 3D following formation of an interlayer dielectric and inter-layer and intra-layer interconnects, in accordance with another embodiment of the present invention.

In FIG. 3E, after the silicide formation process is completed, an intra-layer interconnect process is performed to provide horizontal conductive paths by forming various metal lines 96a, 96b which interconnect the active regions of the neighboring devices. The reduced contact resistance in the second active regions 92 enables the input signals applied to the second active regions 92 to be transferred with less resistance than the input signals applied to the first active regions 86. A dielectric material, such as, for example, silicon oxide derived from TEOS, is then deposited to form a interlayer dielectric 98 over the top surface of the substrate 70 and the surface is planarized. An inter-layer interconnect process is then performed to provide vertical conductive paths 99a, 99b by forming via holes through the interlayer dielectric 98 and filling the via holes with a conductive material.

Given the guidance of the present disclosure and disclosed objectives, the optimum mask layer material, silicide material, dielectric material, contact resistance, implantation dosage and energy, impurity concentration, temperature, time, and thickness can be easily determined in a particular situation.

As shown, the methods of the present invention provide various contact resistances depending on each device's criticality and influence on the overall chip speed performance by selectively controlling the impurity concentration of the active regions and thickness of the silicide layers formed on the active regions. Accordingly, the present invention provides an unconventional approach to increase the overall chip speed while reducing the manufacturing costs.

Although the present invention has been described and illustrated in detail, it is to be clearly understood that the same is by way of illustration and example only and is not to be taken by way of limitation, the spirit and scope of the present invention being limited only by the terms of the appended claims.

What is claimed is:

1. A method of selectively controlling contact resistance in semiconductor devices, comprising the steps of:

forming first silicide layers having a first thickness on first active regions having a first impurity concentration in a first device region; and forming second silicide layers having a second thickness greater than the first thickness on second active regions having a second impurity concentration smaller than the first impurity concentration in a second device region.

2. The method of claim 1, wherein the step of forming the first silicide layers further comprises the steps of:

masking the second device region;

forming the first active regions having the first impurity concentration within the first device region; and forming the first silicide layers on the first active regions.

3. The method of claim 2, wherein the step of forming the second silicide layers further comprises the steps of:

unmasking the second device region;

masking the first device region;

forming the second active regions having the second impurity concentration within the second device regions;

forming the second silicide layer on the second active regions; and unmasking the first device region.

4. The method of claim 1, wherein the steps of forming the first and second suicide layers include:

masking the second device region and forming the first active regions having the first impurity concentration within the first device region;

unmasking the second device region;

masking the first device region and forming the second active regions having the second impurity concentration within the second device region;

unmasking the first device region; and simultaneously forming the first silicide layers on the first active regions and the second silicide layers on the second active regions.

5. The method of claim 1, wherein the first and second active regions contain an impurity comprising at least one of boron, phosphorus, arsenic, indium and antimony.

6. The method of claim 1, wherein the first and second silicide layers are $TiSi_2$, $CoSi_2$, or $NiSi_2$.

7. A method of selectively controlling contact resistance in semiconductor devices, comprising the steps of:

forming first active regions having a first impurity concentration within a first device region and second active regions having a second impurity concentration smaller than the first impurity concentration within a second device region; and forming silicide on the first and second active regions.

8. The method of claim 7, wherein the step of forming the first and second active regions further comprises the steps of:

masking the first device region;

forming the second active regions having the second impurity concentration within the second device region;

unmasking the first device region;

masking the second device region; and forming the first active regions having the first impurity concentration within the first device region.

9. The method of claim 8, wherein the step of forming silicide further comprises the steps of:

forming first silicide layers having a first thickness on the first active regions;

unmasking the second device region;

making the first device region;

forming second silicide layers having a second thickness greater than the first thickness on the second active regions; and unmasking the first device region.

10. The method of claim 7, wherein the first and second active regions contain an impurity comprising at least one of boron, phosphorus, arsenic, indium, and antimony.

11. The method of claim 7, wherein the first and second silicide layers are $TiSi_2$, $CoSi_2$, or $NiSi_2$.

* * * * *